(12) United States Patent
Xu et al.

(10) Patent No.: US 7,561,258 B2
(45) Date of Patent: Jul. 14, 2009

(54) WAFER TILT DETECTION APPARATUS AND METHOD

(75) Inventors: Songlin Xu, Fremont, CA (US); Li Hou, Cupertino, CA (US); Stephen Hyatt, Cupertino, CA (US)

(73) Assignee: Mattson Technology, Inc., Fremont, CA (US)

( * ) Notice: Subject to any disclaimer, the term of this patent is extended or adjusted under 35 U.S.C. 154(b) by 236 days.

(21) Appl. No.: 11/749,611

(22) Filed: May 16, 2007

(65) Prior Publication Data

US 2007/0269910 A1 Nov. 22, 2007

Related U.S. Application Data

(60) Provisional application No. 60/802,210, filed on May 19, 2006.

(51) Int. Cl.
*H01L 21/66* (2006.01)
*G01J 3/443* (2006.01)

(52) U.S. Cl. .......................................... 356/72; 438/16

(58) Field of Classification Search .................. 356/72; 438/16
See application file for complete search history.

(56) References Cited

U.S. PATENT DOCUMENTS 5,362,969 A * 11/1994 Glenn ................... 250/559.18

* cited by examiner

*Primary Examiner*—F. L Evans
(74) *Attorney, Agent, or Firm*—Pritzkau Patent Group LLC

(57) ABSTRACT

An exemplary embodiment providing one or more improvements includes a wafer tilt detection apparatus for use with a wafer processing or manufacturing device that applies a process to the wafer and which utilizes an endpoint signal for determining control of the process applied to the wafer. The wafer tilt apparatus uses the endpoint signal in establishing when the wafer was in a tilted orientation during processing.

22 Claims, 6 Drawing Sheets

WAFER TILT DETECTION APPARATUS AND METHOD

RELATED APPLICATION

The present application claims priority from U.S. Provisional Patent Application Ser. No. 60/802,210, filed on May 19, 2006 which is incorporated herein by reference in its entirety.

The present device and method relates generally to the field of semiconductor wafer manufacturing and processing, and more particularly, to an apparatus and method which determines when a semiconductor wafer was in a tilted orientation during the application of a process to the wafer.

BACKGROUND

Semiconductor fabrication typically involves applying several different processes to a semiconductor wafer at different times during the manufacturing process. Most of these processes involve the application of gas and/or plasma to the wafer while the wafer is positioned on a pedestal in a processing chamber of a processing machine or device. In some instances, a processing device will have more than one pedestal to allow multiple wafers to be processed simultaneously. Simultaneous processing of wafers increases the production rate of wafers resulting in higher profits and faster production.

Many modern processing devices make use of an optical spectrometer in controlling the process in the chamber. Optical emission spectroscopy (OES) involves the use of the optical spectrometer to monitor the intensity of one or more selected wavelengths of the plasma in the chamber for changes during the process. The intensity of the wavelength is plotted over time as a process endpoint signal which provides a convenient way to track changes in the selected wavelength. Certain changes in the intensity are used to identify when the process is completed. For instance, in some cases when a photoresist stripping or ashing process is completed there is a distinct drop in the amplitude of the endpoint signal corresponding to a drop in the intensity of the wavelength when the process is completed.

It has been recognized that in order to ensure optimum plasma uniformity and heat transfer profile on the wafer, the wafer must be properly positioned on the pedestal. When the wafer is not properly positioned on the pedestal, there is an increased incidence of defects in the wafer resulting from the process. One such position is when the wafer is tilted with respect to the way in which the wafer is designed to sit on the pedestal. In the tilted orientation one side of the wafer is separated from contact with the pedestal. One cause of the wafer assuming the tilted orientation is the result of a stray piece of material accidentally becoming positioned between the wafer and the pedestal. Another cause can be if the pedestal or other part of the processing device becomes loose or detached in the processing device such as loose or stuck lift pins. Other causes can also result in the wafer not being properly positioned during the application of the process.

Problems relating to the improperly positioned wafer can arise in some instances where the pedestal serves to heat the wafer during the process. A slight variation in the horizontal arrangement or tilt of the wafer with respect to the pedestal in these and other circumstances can result in an increased number of wafer defects, thereby reducing yield and increasing production costs.

Visual inspection of each wafer as it is placed on the pedestal can determine if the wafer is tilted. Many processing devices have inspection windows which allow for the observation of the wafer in the processing chamber. However, this manual approach is cumbersome and costly and may not be practical for other reasons related to the frequency in which these problems arise.

The foregoing examples of the related art and limitations related therewith are intended to be illustrative and not exclusive. Other limitations of the related art will become apparent to those of skill in the art upon reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In general, a wafer tilt detection apparatus and method is described in which a wafer is determined to have been tilted during an application of a process to the wafer by using an endpoint signal relating to the process applied.

One embodiment involves, by way of example, a method for detecting a relative tilt in a system for processing wafers using a process in which an endpoint signal is generated for indicating that the process is complete as each of the wafers is processed, the method involves detecting the relative tilt of a particular semiconductor wafer from a reference orientation in an apparatus for applying a semiconductor manufacturing process to the particular wafer, where the process is applied to the particular wafer and the endpoint signal is generated for the process applied to the particular wafer. The endpoint signal, in conjunction with at least one other signal, is used to establish that the particular wafer was processed in a tilted orientation with respect to the reference orientation.

Another exemplary embodiment involves a tilt detection apparatus for use with a manufacturing apparatus for processing wafers using a process in which an endpoint signal is generated for indicating that the process is complete as each of the wafers is processed. In this instance, the tilt detection apparatus is used for detecting a relative tilt of a particular semiconductor wafer from a reference orientation in the manufacturing apparatus in which the process is applied to the particular wafer. An endpoint signal generator generates an endpoint signal of the process applied to the particular wafer and a processor receives the endpoint signal and uses the endpoint signal in conjunction with at least one other signal to establish that the particular wafer was processed in a tilted orientation with respect to the reference orientation.

In addition to the exemplary aspects and embodiments described above, further aspects and embodiments will become apparent by reference to the drawings and by study of the following descriptions.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology such as, for example, upper/lower, right/left, front/rear top/bottom, underside and the like may be adopted for purposes of enhancing the reader's understanding, with respect to the various views provided in the figures, and is in no way intended as being limiting.

Figure 1:
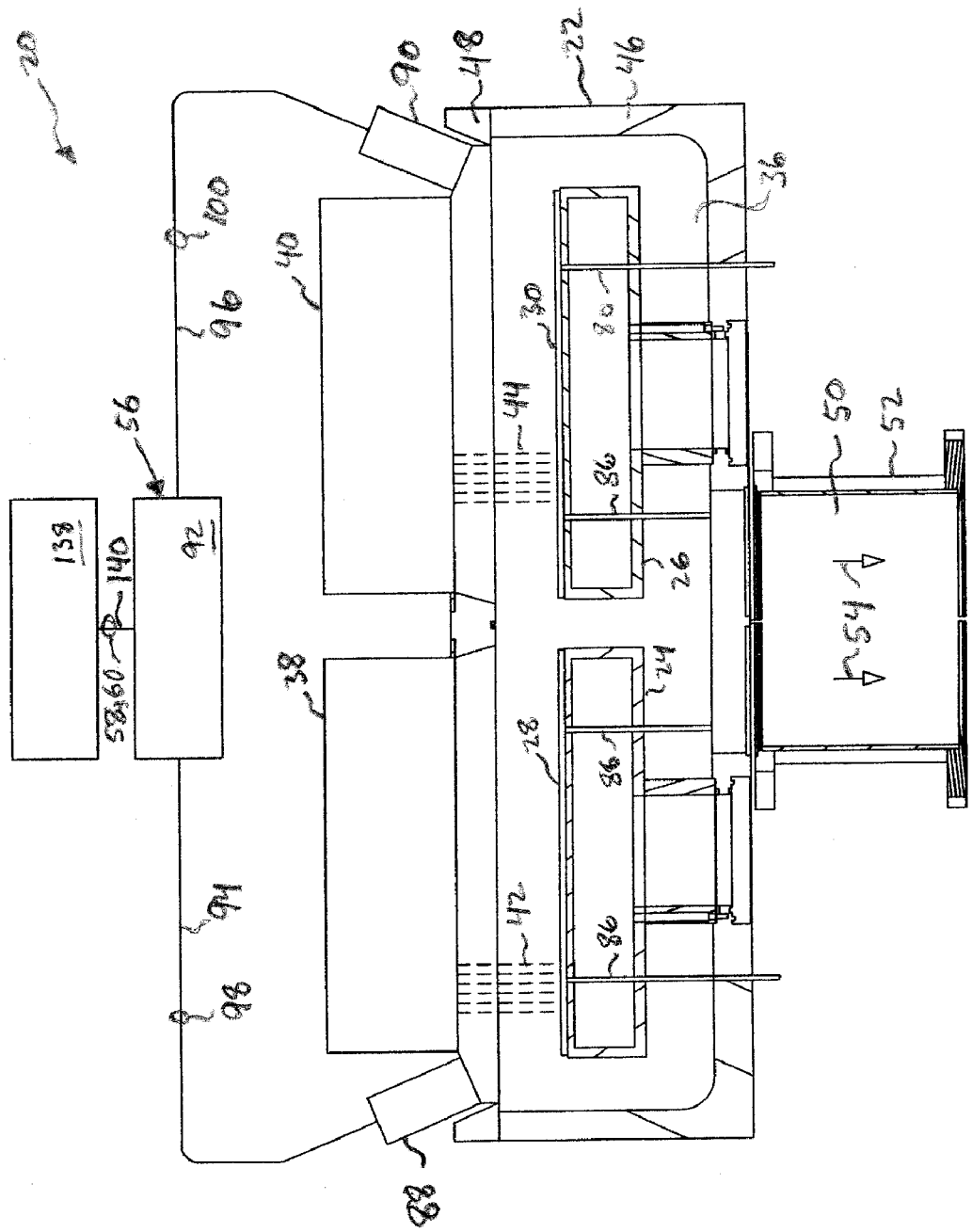
FIG. 1 is an illustration of a tilt detection apparatus for determining when a wafer is in a tilted orientation, along with a cross section view of a wafer processing device during the application of a process to two wafers which are both positioned in a non-tilted orientation.
Figure 2:
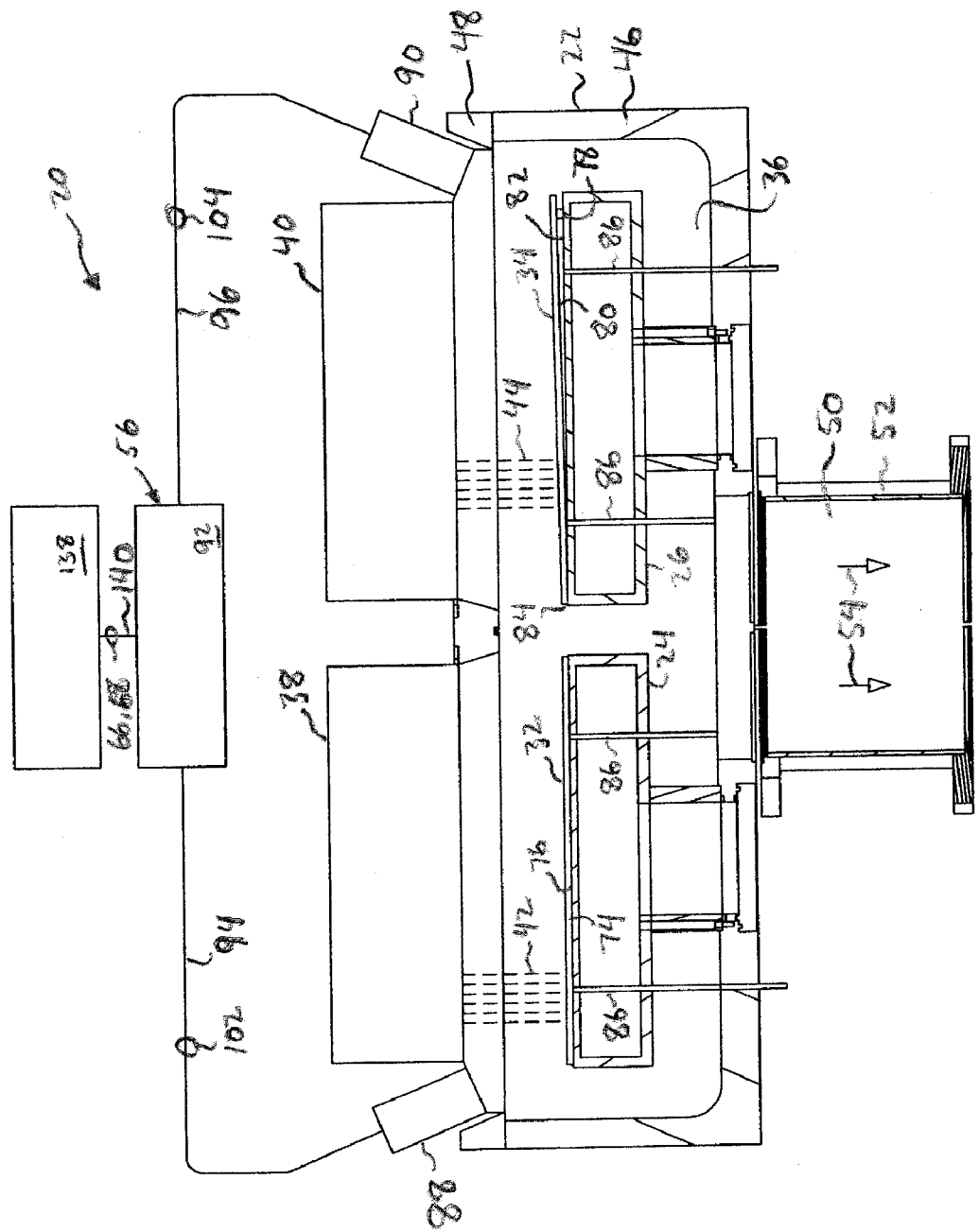
FIG. 2 is an illustration of the tilt detection apparatus and wafer processing device shown in FIG. 1 during the application of the process to one wafer in a non-tilted reference orientation and another wafer in a tilted orientation.

Attention is now directed to the figures wherein like reference numbers may be applied to like components. A semiconductor wafer tilt detection apparatus 20, which incorporates the present invention, is shown in FIGS. 1 and 2 in conjunction with a semiconductor manufacturing device 22. The manufacturing device shown is typical of the types of devices used in producing semiconductor devices by applying processes to semiconductor wafers. Manufacturing device 22 includes two pedestals 24 and 26 for supporting wafers 28 and 30 (FIG. 1) and wafers 32 and 34 (FIG. 2) in a processing chamber 36 during an application of a process to the wafers. Wafers 28 and 30 are shown in FIG. 1 on the pedestals 24 and 26 in a non-tilted orientation during the application of the process to the wafers. Wafers 32 and 34 are shown in FIG. 2 on the pedestals 24 and 26 with wafer 32 in a non-tilted orientation and wafer 34 in a tilted orientation. Other manufacturing devices 22 may be capable of applying the process to more or less than two wafers at a time. The two wafer manufacturing device shown in FIGS. 1 and 2 is exemplary and provides a basis for understanding the detection apparatus 20 in single or multiple wafer manufacturing devices.

For the purposes of the present example, a process involving the application of plasma to wafers 28, 30, 32 and 34 is shown in FIGS. 1 and 2. Plasma sources 38 and 40 supply plasmas, represented by dashed lines 42 and 44, to chamber 36 during the process. Chamber 36 is generally defined by a chamber bowl 46 and a chamber lid 48. An exhaust channel 50 in an exhaust conduit 52 maintains processing conditions with respect to pressure and removes by products as represented by arrows 54. Many different types of processes can be applied in manufacturing device 22, such as in a chemical vapor deposition, atomic layer deposition, plasma etch and/or others.

Manufacturing device 22 utilizes an endpoint signal generator, such as an optical emission spectrometer 56 shown in FIGS. 1 and 2, for determining when the process is completed. During the processing of wafers 28 and 30 shown in FIG. 1, spectrometer 56 generates and monitors endpoint signals 58 and 60 (FIG. 3) for amplitude change endpoint features 62 and 64 or other endpoint feature which signal that the process is completed. Once the process is completed, manufacturing device 22 terminates the generation of plasma 42 and 44 to chamber 36 so that wafers 28 and 30 can be removed and replaced with other wafers to be processed. Endpoint signals 66 and 68 (FIG. 4) are generated by spectrometer 56 during the processing of wafers 32 and 34 (FIG. 2) and include endpoint features 70 and 72, which signal the end of the process applied to wafers 32 and 34.

The new and useful detection apparatus 20 takes advantage of the endpoint signals from optical emission spectrometer 56 to determine when one of the wafers in the processing chamber was in a tilted orientation with respect to a reference orientation during the application of the process to the wafers. One example of the tilted orientation is shown by wafer 34 in FIG. 2 and a reference orientation is shown wafer 32 in the same figure. In the reference orientation, a lower surface 74 of wafer 32 is in substantially complete contact with an upper surface 76 of pedestal 24 supporting wafer 32. In contrast, wafer 34 is shown in FIG. 2 having a tilted orientation with respect to wafer 32 and pedestal 26. The cause of the tilted orientation shown in FIG. 2 is a wafer particle 78 that is positioned between a lower surface 80 of wafer 34 and an upper surface 82 of pedestal 26. Note that the tilted orientation is exaggerated for illustrative purposes. The position of wafer particle 78 results in only an edge 84 of wafer 34 contacting upper surface 82 of pedestal 26. Other particles or causes can also result in the wafer assuming the tilted orientation, for instance lift pins 86 may be displaced during processing, thereby causing the wafer to be in the tilted orientation.

Figure 3:
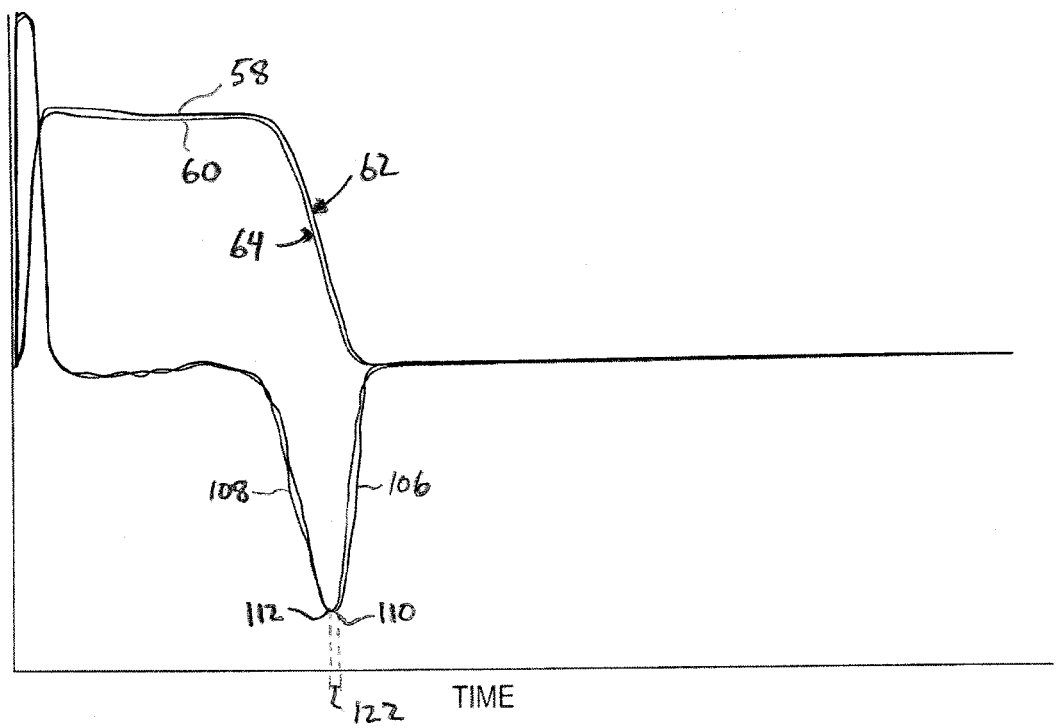
FIG. 3 is a waveform diagram of an endpoint signal of the process applied to the wafers shown in FIG. 1.
Figure 4:
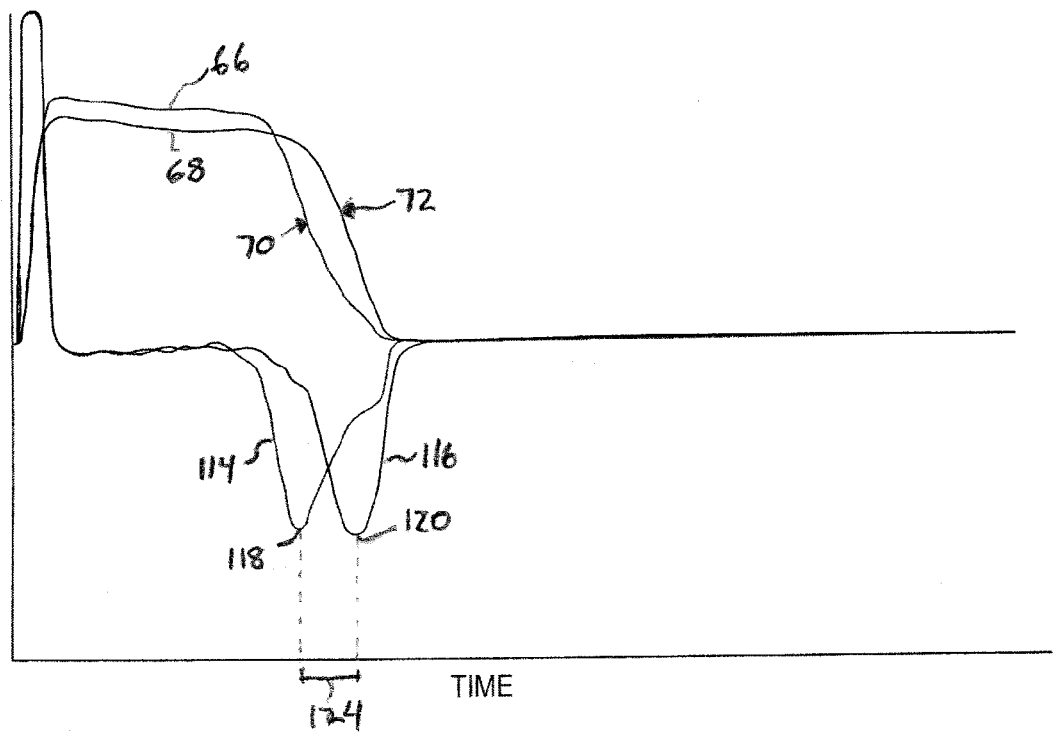
FIG. 4 is a waveform diagram of an endpoint signal of the process applied to the wafers shown in FIG. 2.

A noticeable difference is apparent between the endpoint signals shown in FIG. 3 and the endpoint signals shown in FIG. 4. The reason for this difference is that neither wafer 28 or 30 is in the tilted orientation when endpoint signals 58 and 60 (FIG. 3) are generated, while wafer 32 is not tilted and wafer 34 is tilted when endpoint signals 66 and 68 (FIG. 4) are generated. The comparison reveals that endpoint signal 66 is significantly shifted relative to endpoint signal 68, while endpoint signal 58 is not significantly shifted relative to endpoint signal 60. The shift is particularly noticeable when the difference between endpoint features 62 and 64 shown in FIG. 3 is compared with the difference between endpoint features 70 and 72 shown in FIG. 4. Since the endpoint signals are already generated for use in controlling the process and with this description in hand, determining and using the shift to detect when a wafer was in a tilted orientation during processing is a matter of processing the endpoint signals.

In the present example, optical emission spectrometer 56 includes cameras 88 and 90 which are connected to a processor 92 with cables 94 and 96. The cameras 88 and 90 view plasmas 42 and 44 respectively, and produce spectrum signals 98 and 100 (FIG. 1) relating to a spectrum of plasmas 42 and 44 applied to wafers 28 and 30, and produce spectrum signals 102 and 104 (FIG. 2) relating to the spectrum of plasmas 42 and 44 applied to wafers 32 and 34. Spectrometer 56 receives spectrum signals 98, 100, 102 and 104 from cameras 88 and 90 and generates the endpoint signals in response.

Using spectrum signals 98 and 100, processor 92 generates endpoint signals 58 and 60 (FIG. 3) for wafers 28 and 30 (FIG. 1) and generates endpoint signals 66 and 68 (FIG. 4) for wafers 32 and 34 (FIG. 2). Processor 92 processes generates endpoint signals 58, 60, 66 and 68 using narrow band filters or other processing to monitor a single frequency or narrow frequency range of optical energy emitted by plasmas 42 and 44 in chamber 34. Endpoint signals 58, 60, 66 and 68 are signals representing the intensity of the monitored frequency over the processing time. Endpoint signals 58, 60, 66 and 68 are exemplary of the types of endpoint signals produced by endpoint signal generators which will vary slightly between processes of the same type, and will vary from one process type to another.

One way in which to determine the amount of shift between the endpoint signals is to determine the derivative of each of the endpoint signals. The derivatives of the endpoint signals provide peaks which are easily detected to allow the amount of shift to be determined. Derivative signals 106 and 108 of endpoint signals 58 and 60 are shown in FIG. 3 with negative going peaks 110 and 112; and derivative signals 114 and 116 of endpoint signals 66 and 68, are shown in FIG. 4 with negative going peaks 118 and 120.

A time variation 122 is shown between derivative peaks 110 and 112 in FIG. 3 which represents the time shift between endpoint signals 58 and 60 for non-tilted wafers 28 and 30. Another time variation 124 is shown between derivative peaks 118 and 120 in FIG. 4 which represents the time shift between endpoint signals 66 and 68 for non-tilted wafer 32 and tilted wafer 34. Time variations 122 and 124 provide a convenient way to assess whether or not the process was applied to a wafer while the wafer was in the tilted orientation, as is discussed below.

A total process time curve 126 (FIG. 5) shows the total process times of a series of runs of wafers on pedestal 24, and a total process time curve 128 shows the total process times of the series of runs for wafers on the pedestal 26. The vertical distance between curves 126 and 128 represents the time variation between the total process times of the processes applied to each pair of wafers in the runs. One interesting aspect illustrated by the process time curves 126 and 128 is that even though the total process times may vary significantly between different runs, the time variation between the processes applied in the same run are typically very small, except when one of the wafers is in the tilted orientation as shown by variation time 124.

To take advantage of the time variation exhibited when a wafer is in the tilted orientation, a threshold range 130 is established. Threshold range 130 (FIG. 5) corresponds to a range of time variations where both wafers were in the reference orientation. Whether or not a wafer was in a tilted orientation during processing can be established by calculating a time variation and then determining if the time variation for the process was within the threshold range 130. If the calculated time variation is not within threshold range 130 then one or the other of the wafers processed was in the tilted orientation during the process. Typically, when two wafers are processed at the same time and one of the wafers is in the tilted orientation, the endpoint curve of the tilted wafer will follow the endpoint curve of the non-tilted wafer by a time variation that exceeds the threshold range 130.

In the present example, if the endpoint curve of the wafer on pedestal 24 leads the endpoint curve of the wafer on pedestal 26 (FIG. 4), then the time variation is a negative value and if the endpoint curve of the wafer on pedestal 26 leads the endpoint curve of the wafer on pedestal 24, then the time variation is a positive value.

On occasion, both of the wafers may be in a tilted orientation during processing. In this instance, if one of the wafers is tilted more than the other wafer, then the endpoint curve of the more tilted wafer will follow the endpoint curve of the wafer that is less tilted. It is very unlikely that both of the wafers will be tilted by the exact same amount during the application of a process to the wafers.

The threshold range 130 utilizes maximum and minimum threshold times. If the time variation 124 is more than the maximum positive threshold time, represented by a maximum positive threshold signal 132 (FIG. 5), then the wafer on pedestal 24 is in the tilted orientation. If the time variation 124 is less than the maximum negative threshold time, represented by a maximum negative threshold signal 134, then the wafer on pedestal 26 is in the tilted orientation.

Figure 5:
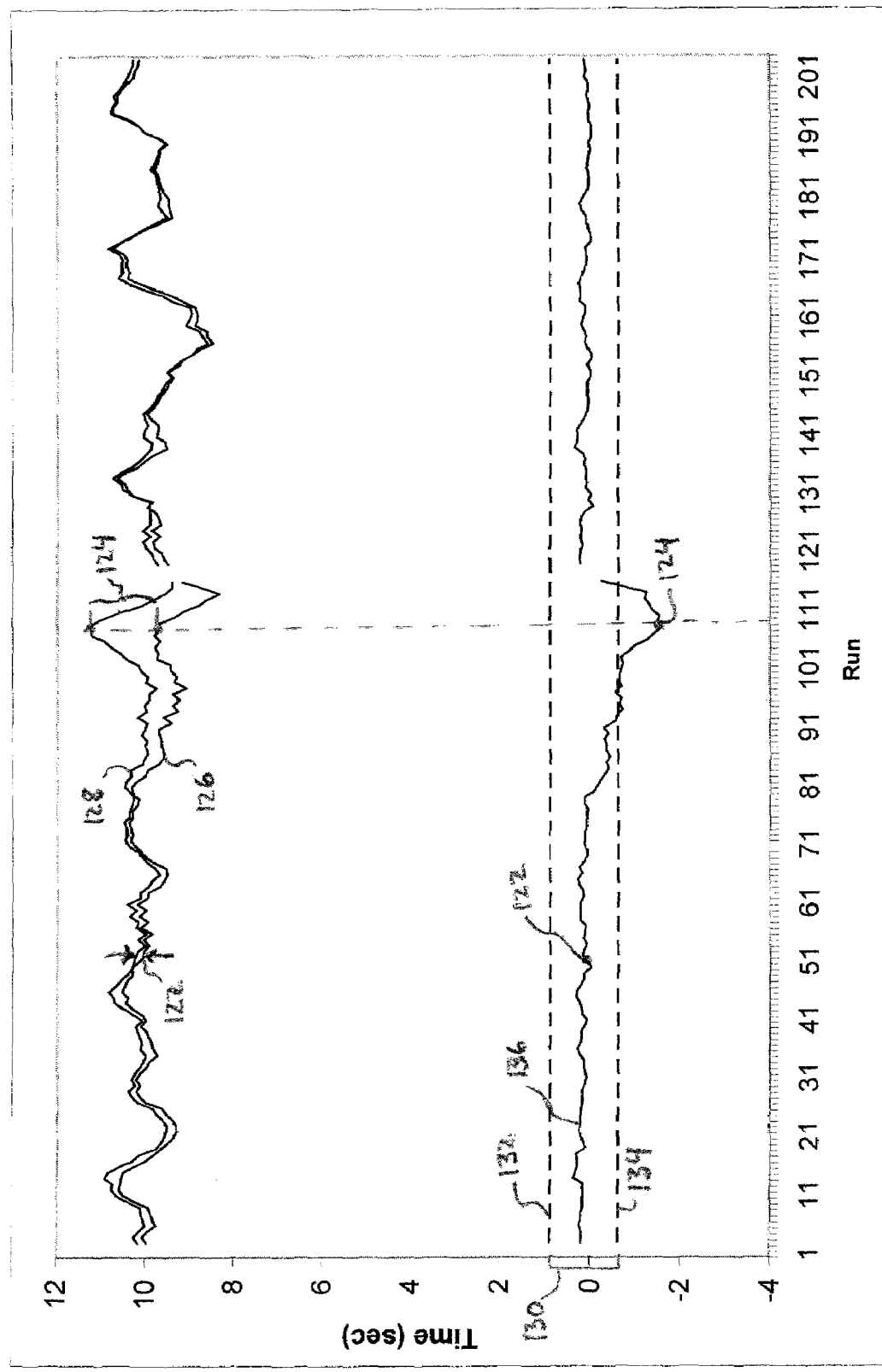
FIG. 5 is a diagram of total process times for a series of processes applied to the wafers shown in FIGS. 1 and 2 and others, illustrating time differences between processes applied to wafers simultaneously.

A time variation curve 136 (FIG. 5) shows the time variations between the total process time curves 126 and 128 for the series of runs. Time variation 122 for the process in FIGS. 1 and 3 is shown on the time variation curve 136 at a point that is within the threshold range 130, below the maximum positive threshold signal 132 and above the maximum negative threshold signal 134. On the other hand, time variation 124 for the process in FIGS. 2 and 4 is shown on time variation curve 136 at a point that is out of threshold range 130 because time variation 124 is below maximum negative threshold signal 134. As shown in FIG. 5, maximum threshold time 130 is set with the positive threshold signal 132 at 0.9 seconds and the negative threshold signal 134 at −0.6 seconds. These threshold signals 132 and 134 are exemplary; other values of threshold signal can also be used and may depend on the manufacturing device and/or process being applied.

A threshold processor 138 (FIGS. 1, 2 and 6) of the detection apparatus 20 is connected to processor 92 with a bus 140 or other signal path to receive endpoint signals 58 and 60 (FIG. 3) and 66 and 68 (FIG. 4) from processor 92 and to generate an indicator signal 142 (FIG. 6) in response. One state of indicator signal 142 causes an indicator 144 to indicate when a wafer was processed in the tilted orientation. Indicator 144 can provide audible and/or visual notification to a user of manufacturing device 22 when a tilted wafer is discovered. Indicator 144 can also cause manufacturing device 22 to terminate processing of the wafers or some other appropriate response until the cause of the tilted wafer is corrected. Another state of indicator signal 142 does not create a response in indicator 144, or may cause the indicator to indicate that no wafer tilt is detected.

Figure 6:
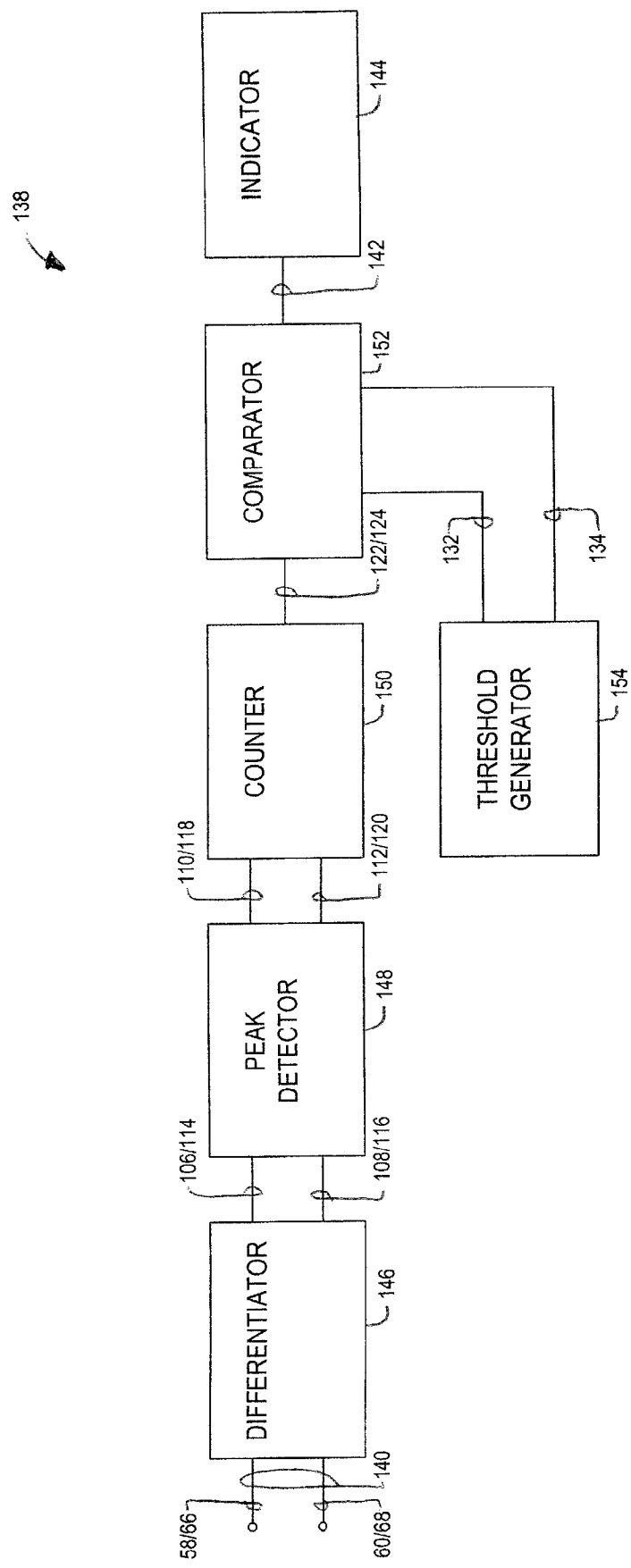
FIG. 6 is a block diagram of the tilt detection apparatus shown in FIGS. 1 and 2.

Threshold processor 138 shown in FIG. 6 is a digital processor and receives endpoint signals 58 and 60 or 66 and 68 on bus 140 in a digital format. Processor 138 can also be analog or a combination of analog and digital. For the process shown in FIGS. 1 and 3, the threshold processor 138 (FIG. 6) receives endpoint signals 58 and 60 on bus 140 at a differentiator circuit 146 of the threshold processor 138. The differentiator circuit 146 determines the slopes of endpoint signals 58 and 60 and generates derivative signals 106 and 108 in response. Derivative signals 106 and 108 are sent to a peak detector 148 of threshold processor 138 which determines when derivative signals 106 and 108 have reached peaks 110 and 112, respectively. A counter 150 of threshold processor 138 receives peaks 110 and 112 from peak detector 148 and counts time variation 122 between peaks 110 and 112.

A comparator 152 of threshold processor 138 receives time variation 122 from counter 150 as well as maximum positive threshold signal 132 and maximum negative threshold signal 134 from a threshold generator 154 of threshold processor 138. Threshold generator 154 includes adjustment capabilities for setting maximum positive and negative threshold signals 132 and 134. Comparator 152 compares time variation 122 to maximum positive and negative threshold signals 132 and 134 to determine if time variation 122 is within threshold range 130. Comparator 152 generates indicator signal 142 which varies depending on whether or not time variation 122 is within threshold range 130. If the variation time is within threshold range 130, as is the case with the variation time 122, then indicator 144 does not indicate that a wafer was tilted during processing.

In the case of the process shown in FIGS. 2 and 4, threshold processor 138 receives endpoint signals 66 and 68 on bus 140 and differentiator circuit 146 generates derivative signals 114 and 116. Peak detector 148 receives derivative signals 114 and 116 and determines peaks 118 and 120. Counter 150 receives derivative peaks 118 and 120 from detector 148 and counts time variation 124 which is then sent to comparator 152. Comparator 152 compares time variation 124 with maximum positive and negative threshold signals 132 and 134 and generates indicator signal 142. In this case, time variation 124 exceeds negative threshold signal 134, (FIG. 5) so indicator 144 responds to indicator signal 142 by indicating that a wafer, (in this case wafer 34) has been processed in the tilted orientation.

Figure 7:
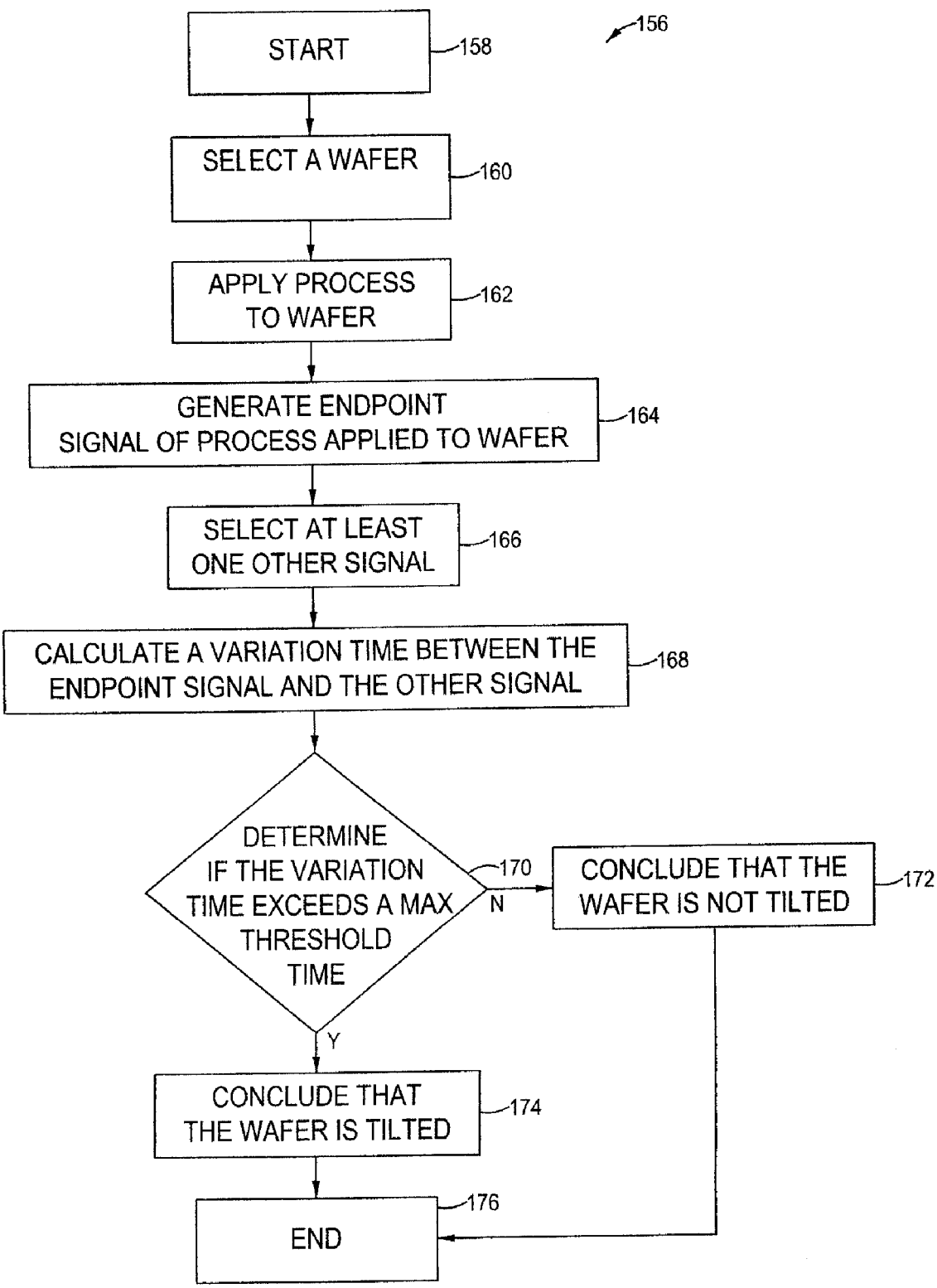
FIG. 7 is a flow chart illustrating a method of determining whether a wafer was in a tilted orientation during the process applied as shown in FIGS. 1 and 2.

An exemplary method 156 for determining when the wafer is in a tilted orientation is shown in FIG. 7. Not all of the steps may be required in all circumstances, and the steps do not necessarily have to be performed in the order shown in FIG. 7. Furthermore, the wafer tilt detection may be performed manually by an engineer or other personnel by observation of the endpoint signals. Method 156 begins at a start 158 from which the method proceeds to select wafer 30/34 at 160. After the wafer is selected, the method then advances to 162 where a process is applied to the selected wafer. After or during the application of the process to the selected wafer, method 156 then proceeds to 164 where endpoint signal 60/68 of the process is generated. At least one other signal is selected at 166 as a reference signal. The reference signal can be, for example, another endpoint signal 58/66 generated for wafer 28/32 that is in a reference orientation. Other types of signals may also be used for reference purposes, provided that a distinction between the signal and the endpoint signal allow for the determination that the selected wafer is tilted.

After the reference signal is selected at 166, method 156 proceeds to 168 where variation time 124/122 between the endpoint signal and the reference signal is calculated. Once the variation time is calculated, method 156 advances to 170 where a determination is made as to whether or not the variation time exceeds maximum threshold time 130. If the determination at 170 is that the maximum threshold time is not exceeded by the variation time, then the method proceeds to 172 where it is concluded that the selected wafer was not tilted during the processing. From 172, method 156 then proceeds to an end 174.

If the determination at 170 is that the variation time exceeds the maximum threshold time, then method 156 proceeds to 176 where it is concluded that the selected wafer was tilted during the processing. After the conclusion at 176, the method then ends at 174.

The foregoing example discusses processing two wafers simultaneously and comparing their endpoint signals to determine a time variation; however the advantageous new tilt detection apparatus and method is also able to be used in single wafer manufacturing devices. In this instance, the time variation is determined by comparing endpoint signals of wafers that are processed in series rather than simultaneously. In this instance, a memory (not shown) may be included in processor 138 or other equipment for storing endpoint signal data to later use with the endpoint signal of the selected wafer to determine if the selected wafer was in the tilted orientation during processing.

The wafer tilt detection apparatus and method allow a manufacturer or other producer of processed wafers to determine when a wafer was processed in a tilted orientation in order to correct the cause of the orientation problem before other wafers are processed. Correcting wafer orientation problems increases yields in wafers produced after the first wafer orientation problem is determined. Increased yields are important for fast and economical production of semiconductor and other devices.

The wafer tilt detection apparatus and method can advantageously utilize an existing endpoint signal generated by an optical emission spectrometer or other endpoint signal generator in determining when the wafer is in the tilted orientation. For other processing devices, where an endpoint signal generator is not already provided, the wafer tilt detection apparatus can include the endpoint signal generator.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. In a system for processing wafers using a process in which an endpoint signal is generated for indicating that the process is complete as each of the wafers is processed, a method for detecting a relative tilt of a particular semiconductor wafer from a reference orientation in an apparatus for applying a semiconductor manufacturing process to the particular wafer, the method comprising:
    applying the process to the particular wafer;
    generating the endpoint signal of the process applied to the particular wafer; and
    using the endpoint signal, generated from processing the particular wafer, in conjunction with at least one other signal to establish that the particular wafer was processed in a tilted orientation with respect to said reference orientation.

2. A method as defined in claim 1 wherein the at least one other signal is at least one other endpoint signal generated for a different one of the wafers.

3. A method as defined in claim 2 wherein the process is applied to the different one of the wafers while the process is applied to the particular wafer.

4. A method as defined in claim 2 wherein the process is applied to the different one of the wafers before the process is applied to the particular wafer.

5. A method as defined in claim 2 wherein the process is applied to the particular wafer before the process is applied to the different one of the wafers.

6. A method as defined in claim 2 wherein the endpoint signal and the at least one other endpoint signal are generated using optical emission spectroscopy.

7. A method as defined in claim 1 wherein the endpoint signal is generated using optical emission spectroscopy.

8. A method as defined in claim 1 wherein the process applied to the particular wafer is a photoresist stripping process.

9. A method as defined in claim 1 wherein the at least one other signal is at least one other endpoint signal generated for a different one of the wafers that is positioned in the reference orientation.

10. A method as defined in claim 1 wherein using the endpoint signal includes comparing a variation time between a feature of the endpoint signal and the other signal to a maximum threshold time.

11. A method as defined in claim 10 wherein the variation time is greater than the maximum threshold time when the particular wafer was processed in a tilted orientation.

12. In a manufacturing apparatus for processing wafers using a process in which an endpoint signal is generated for indicating that the process is complete as each of the wafers is processed, a tilt detection apparatus for detecting a relative tilt of a particular semiconductor wafer from a reference orientation in the manufacturing apparatus in which the process is applied to the particular wafer, comprising:
- an endpoint signal generator for generating an endpoint signal of the process applied to the particular wafer; and
- a processor for receiving the endpoint signal and for using the endpoint signal in conjunction with at least one other signal to establish that the particular wafer was processed in a tilted orientation with respect to said reference orientation.

13. The detection apparatus as defined in claim 12, wherein:
- the manufacturing apparatus applies the process to a different one of the wafers;
- the endpoint signal generator generates at least one other endpoint signal for the different one of the wafers; and
- the processor uses the at least one other endpoint signal in conjunction with the endpoint signal to establish that the particular wafer was processed in the tilted orientation.

14. The detection apparatus as defined in claim 13 wherein the manufacturing apparatus applies the process to the different one of the wafers while the manufacturing apparatus applies the process to the particular wafer.

15. The detection apparatus as defined in claim 13 wherein the manufacturing apparatus applies the process to the different one of the wafers before the manufacturing apparatus applies the process to the particular wafer.

16. The detection apparatus as defined in claim 13 wherein the manufacturing apparatus applies the process to the particular wafer before the manufacturing apparatus applies the process to the different one of the wafers.

17. The detection apparatus as defined in claim 13, wherein:
- the endpoint signal generator includes an optical emission spectrometer and the endpoint signal is derived from an optical spectrum of the process applied to the particular wafer using the optical emission spectrometer; and
- the at least one other endpoint signal is derived from an optical spectrum of the process applied to the different one of the wafers using the optical emission spectrometer.

18. The detection apparatus as defined in claim 12, wherein:
- the endpoint signal generator includes an optical emission spectrometer; and
- the endpoint signal is derived from the optical spectrum of the process applied to the particular wafer using the optical emission spectrometer.

19. The detection apparatus as defined in claim 12 wherein the manufacturing apparatus applies a photoresist stripping process to the particular wafer.

20. The detection apparatus as defined in claim 12 wherein the endpoint signal generator generates an endpoint signal for a different one of the wafers as the at least one other signal.

21. The detection apparatus as defined in claim 12 wherein the processor determines a variation time between a feature of the endpoint signal and a feature of the at least one other signal and compares the variation time to a maximum threshold time to establish that the particular wafer was processed in the tilted orientation.

22. The detection apparatus as defined in claim 21 wherein the variation time is greater than the maximum threshold time when the particular wafer was processed in the tilted orientation.

* * * * *